United States Patent [19]

Flannagan

[11] Patent Number: 4,763,306

[45] Date of Patent: Aug. 9, 1988

[54] CIRCUIT FOR ENABLING A TRANSMISSION GATE IN RESPONSE TO PREDECODED SIGNALS

[75] Inventor: Stephen T. Flannagan, Austin, Tex.

[73] Assignee: Motorola, Inc., Schaumburg, Ill.

[21] Appl. No.: 944,711

[22] Filed: Dec. 22, 1986

[51] Int. Cl.[4] .............................................. G11C 7/00
[52] U.S. Cl. ..................................... 365/203; 365/190
[58] Field of Search ............... 365/189, 190, 203, 202, 365/204, 230

[56] References Cited

U.S. PATENT DOCUMENTS 4,685,086  8/1987  Tran ..................................... 365/203

Primary Examiner—Joseph A. Popek
Attorney, Agent, or Firm—John A. Fisher; Jeffrey Van Myers; James L. Clingan, Jr.

[57] ABSTRACT

A memory has a transmission gate requiring complementary signals for coupling a bit line to a data line. The complementary signals are generated utilizing a simplified circuit which does not require complementary predecoded signals. Two predecoded signals are further decoded by a circuit which provides the signals needed by the transmission gate. Although simplified circuitry is used, all of the voltage levels provided by the circuitry have a steady state at either the positive power supply or at ground so that there is no steady state current drain caused by signals that are not full rail.

16 Claims, 1 Drawing Sheet

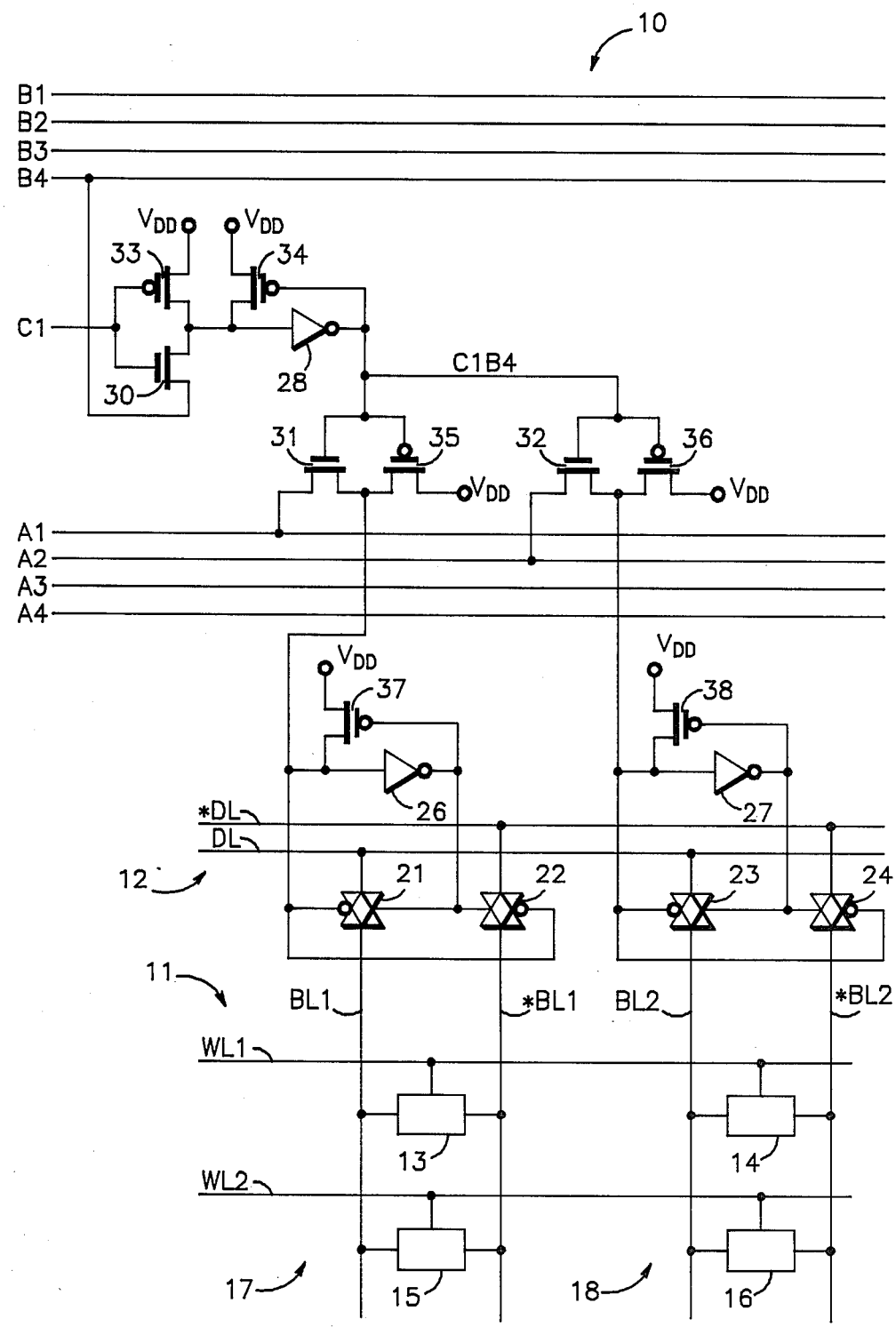

CIRCUIT FOR ENABLING A TRANSMISSION GATE IN RESPONSE TO PREDECODED SIGNALS

FIELD OF THE INVENTION

The present invention relates to CMOS memories, and more particularly, to CMOS memories which have predecoders.

BACKGROUND OF THE INVENTION

In memories there is an address comprised of binary signals which specify a particular location in that memory. The address is generally divided into a row address and a column address. The row address selects a word line which is enabled. The column address selects one or more bit lines which are then used for providing data. In the case of static random access memories (SRAMs), each memory cell is coupled to a pair of bit lines so that each pair is decoded together. As memories become larger, the number of transistors required to perform a row or column decode becomes larger. For example, in the case of a 64K×1 memory, there are 16 address signals required to specify a particular location. This could be arranged as 8 column address signals and 8 row address signals. To use standard logic-gate type decoding would require 8 N channel transistors and 8 P channel transistors at each bit line location that is to be decoded.

To avoid this, predecoding techniques have been developed to avoid having such a large number of transistors at each bit line or word line. One of the objects then of any predecoding technique is to reduce the number of transistors at the particular bit line or word line location. In CMOS, two binary signals can be decoded using four transistors, two N channel transistors and two P channel transistors. This can be reduced to three transistors if both the true and complement of one of the two binary signals are available. This technique has been used to reduce the number of transistors at the bit line decode location. The requirement of both true and complements, however, is a disadvantage. Supplying the true and complement requires additional space on the chip for the conductors which carry these extra signals.

SUMMARY OF THE INVENTION

An object of the present invention is to provide an improved memory which uses a predecoder.

Another object of the invention is to provide improved chip area utilization in a memory which has a predecoder.

Yet another object of the invention is to provide an improved technique for utilizing predecoded signals.

These and other objects are achieved in a memory having a plurality of memory cells located at intersections of word lines and bit lines, a transmission gate, an inverter, a first transistor of a first conductivity type, a second transistor of the second conductivity type, and a third transistor of a second conductivity type. The transmission gate has a first data terminal coupled to a bit line, a second data terminal coupled to a first data line, a first control terminal, and a second control terminal. The inverter has an input coupled to the first control terminal of the transmission gate, and an output coupled to the second control terminal of the transmission gate. The first transistor has a first current electrode coupled to a first power supply terminal, a second current electrode coupled to the input of the inverter, and a control electrode coupled to the output of the inverter. The second transistor has a first current electrode coupled to the first power supply terminal, a second current electrode coupled to the input of the inverter, and a control electrode for receiving a first predecoded signal. The third transistor has a first current electrode coupled to the input of the inverter, a second current electrode for receiving a second predecoded signal, and a control electrode for receiving the first predecoded signal.

BRIEF DESCRIPTION OF THE DRAWINGS

The sole FIGURE is a circuit diagram of a portion of a memory having a circuit according to a preferred embodiment of the invention.

DESCRIPTION OF THE INVENTION

Shown in the FIGURE is a portion of a memory 10 comprised generally of an array portion 11, a decoder portion 12, and data lines DL and *DL. Array portion 12 is comprised of a memory cell 13, a memory cell 14, a memory cell 15, a memory cell 16, a pair of bit lines 17, a pair of bit lines 18, a word line WL1, and a word line WL2. Memory 10 is a static random access memory in which the memory cells provide true and complementary output signals when read and receive true and complementary signals when being written via bit line pairs. Bit line pair 17 is comprised of bit lines BL1 and *BL1. Bit line pair 18 is comprised of bit lines BL2 and *BL2. Memory cells 13 and 15 have true and complementary input/outputs (I/Os) coupled to bit lines BL1 and *BL1, respectively. Memory cells 14 and 16 have true and complementary I/Os connected to bit lines BL2 and *BL2, respectively. The asterisk (*) preceding a designator indicates complement. Memory cells 13–16 each have a control input. The control inputs of memory cells 13 and 14 are connected to word line WL1. The control inputs of memory cells 15 are connected to word line WL2. Memory cells 13–16 provide data to or receive data from the bit lines to which they are connected when the word line to which they are connected is enabled. The circuitry for selecting and enabling a word line is not shown in the FIGURE.

Decoder portion 12 is comprised of a transmission gate 21, a transmission gate 22, a transmission gate 23, a transmission gate 24, an inverter 26, an inverter 27, an inverter 28, an N channel transistor 30, an N channel transistor 31, an N channel transistor 32, a P channel transistor 33, a P channel transistor 34, a P channel transistor 35, a P channel transistor 36, a P channel transistor 37, and a P channel transistor 38. The description of how the decoder portion is coupled together follows.

Transistor 33 has a source connected to a positive power supply terminal VDD which is for receiving a positive power supply voltage such as, for example, 5 volts, a gate for receiving a predecoded signal C1, and a drain. Transistor 30 has a gate for receving signal C1, a first current electrode for receiving a predecoded signal B4, and a second current electrode connected to the drain of transistor 33. Transistor 30 uses the bilateral nature of insulated gate field effect transistors so that the drain and source functions are both utilized at each current electrode. Inverter 28 has an input connected to the drain of transistor 33, and an output. Transistor 34 has an control electrode connected to the output of inverter 28, a source connected to VDD, and a drain connected to the input of inverter 28. Transistor 35 has a source connected to VDD, a gate connected to the output of inverter 28, and a drain. Transistor 31 has first current electrode connected to the drain of transistor 35, a control electrode connected to the output of inverter 28, and a second current electrode for receiving a predecoded signal A1. Inverter 26 has an input connected to the drain of transistor 35, and an output. Transistor 37 has an source connected to VDD, a gate connected to the output of inverter 26, and a drain connected to the input of inverter 26. Transmission gate 21 has a first data terminal connected to data line DL, a second data terminal connected to bit line BL1, a true control input connected to the output of inverter 26, and a complementary control input connected to the drain of transistor 35. Transmission gate 22 has a first data terminal connected to data line *DL, a second data terminal connected to bit line *BL1, a true control input connected to the output of inverter 26, and a complementary control input connected to the drain of transistor 35. Transistor 36 has source connected to VDD, a gate connected to the output of inverter 28, and a drain. Transistor 32 has a first current electrode connected to the drain of transistor 36, a control electrode connected to the output of inverter 28, and a second current electrode for receiving a predecoded signal A2. Inverter 27 has an input connected to the drain of transistor 36, and an output. Transistor 38 has a gate connected to the output of inverter 27, a source connected to VDD, and a drain connected to the input of inverter 27. Transmission gate 23 has a first data terminal connected to data line DL, a second data terminal connected to bit line BL2, a true control input connected to the output of inverter 27, and a complementary control input connected to the drain of transistor 36. Transmission gate 24 has a first data terminal connected to data line *DL, a second data terminal connected to bit line *BL2, a true control input connected to the output of inverter 27, and a complementary control input connected to the drain of transistor 36.

Data lines DL and *DL are coupled to read and write circuitry that is not shown. A selected bit line pair is coupled to data lines DL and *DL for reading data from or writing data to the selected bit line. It has been found to be desirable to use full CMOS transmission gates for coupling a selected bit line pair to the data lines. A full CMOS transmission gate such as transmission gates 21-24 couples both high and low voltages very well. This type of transmission gate performs a coupling function between its two data terminals when its true control input is a logic high and its complementary control input is a logic low. Thus a bit line is selected when the transmission gate that is coupled thereto receives complementary signals comprised of a logic high on its true control input and a logic low on its complementary control input. Implicit, then, in using a full CMOS transmission gate is the requirement of an inverter to generate complementary signal for activating the transmission gate.

In addition to predecoded signals A1, A2, C1, and B4, predecoded signals B1, B2, B3, A3, and A4 are also shown in the FIGURE. This is indicative of signals received by other decoder portions not shown which select other bit lines also not shown. Signals B1-4, A1-4, and C1 are generated from a column address comprised of a plurality of column address signals. Signals B1-4, A1-4, and C1 are active at a logic low. Associated with bit line pair 17 are signals C1, A1, and B4. Associated with bit line pair 18 are signals A2, C1, and B4. Bit line pair 17 is selected when signals A1 and B4 are a logic low and signal C1 is a logic high. Bit line pair 18 is selected when signals B4 and A2 are a logic low and signal C1 is a logic high. The output of inverter 28 is a logical combination of signals C1 and B4 and is called signal C1B4. Signal C1B4 is a logic high only if signal B4 is a logic low and signal C1 is a logic high. Signal C1B4 is also considered a predecoded signal.

When signal C1 is a logic low, transistor 33 will be conductive and transistor 30 will be non-conductive regardless of the logic state of signal B4. The input to inverter 28 is thus a logic high which causes signal C1B4 to be a logic low. If signal C1 is a logic high, transistor 33 is non-conductive and transistor 30 is conductive. Thus the logic state of signal B4 is coupled to the input of inverter 28 when signal C1 is a logic high. If signal B4 is a logic high, transistor 30 will only couple the voltage at VDD minus an N channel threshold voltage to the input of inverter 28, assuming that the logic high of signal C1 is at VDD. This reduced-voltage logic high supplied to inverter 28 is easily interpreted as a logic high so that inverter 28 provides a logic low output. The reduced-voltage logic high does provide a potential problem of current leakage though. This is corrected by transistor 34 which is conductive in response to the output of inverter 28 being a logic high. Transistor 34 thus provides the full VDD voltage to the input of inverter 28. For the case in which signal B4 is a logic low while signal C1 is a logic high, the logic low of signal B4 is coupled to the input of inverter 28 which outputs signal C1B4 at a logic high. Signal C1B4 at a logic high causes transistor 34 to be non-conductive.

Transmission gates 21 and 22 couple bit line pair 17 to data lines DL and *DL when signal C1B4 is a logic high and signal A1 is logic low. When signal C1B4 is a logic low, transistor 35 is conductive and transistor 31 is non-conductive. With transistor 35 conductive, the input to inverter 26 and the complementary control inputs of transmission gates 21 and 22 are at a logic high. With the input to inverter 26 at a logic high, inverter 26 outputs a logic low to the true control inputs of transmission gates 21 and 22. Thus with signal C1B4 at a logic low, transmission gates 21 and 22 are in a decouple mode. When signal C1B4 is at a logic high, transistor 35 is non-conductive and transistor 31 is conductive. Transistor 31 thus couples the logic state of signal A1 to the input of inverter 26 and the complementary control inputs of transmission gates 21 and 22. When signal A1 is a logic high, transistor couples this logic high to inverter 26 and transmission gates 21 and 22 but at one N channel threshold voltage below the voltage at VDD. Inverter 26 interprets this as a logic high and outputs a logic low to transistor 37. Transistor 37 then causes the input to inverter 26 to be at the voltage at VDD. The input to inverter 26 can then be brought to a logic low only when signal C1B4 is a logic high and signal A1 is a logic low. Transistor 31 then couples the logic low of signal A1 to the input of inverter 26 and the complementary inputs of transmission gates 21 and 22. Inverter 26 provides a logic high output to the true control inputs of transmission gates 21 and 22 and to the gate of transistor 37, turning transistor 37 off. With the true control inputs of transmission gates 21 and 22 at a logic high and the complementary control inputs thereof at a logic low, transmission gates 21 and 22 thus provide the desired coupling between bit line pair 17 and data lines DL and *DL.

The operation of transmission gates 23 and 24 is analogous to that for transmission gates 21 and 22. Transistors 36 and 32 are analogous to transistors 35 and 31 respectively, inverter 27 is analogous to inverter 26, and transistor 38 is analogous to transistor 37. With transistor 32 receiving signal A2, transmission gates 23 and 24 couple bit line pair 18 to data lines DL and *DL when signal C1B4 is a logic high and signal A2 is a logic low.

Thus a simplied decoding scheme is provided which does not require true and complementary predecoded signals. The provided decoding scheme is simple, avoids requiring both true and complementary predecoded signals, and enables a transmission gate which requires both true and complementary signals.

I claim:

1. In a memory having a plurality of memory cells located at intersections of word lines and bit lines, a coupling circuit comprising:
    a first transmission gate having a first data terminal coupled to a first bit line, a second data terminal coupled to a first data line, a first control terminal, and a second control terminal;
    a first inverter having an input coupled to the first control terminal of the first transmission gate, and an output coupled to the second control terminal of the first transmisison gate;
    a first transistor of a first conductivity type having a first current electrode coupled to a first power supply terminal, a second current electrode coupled to the input of the first inverter, and a control electrode coupled to the output of the first inverter;
    a second transistor of the first conductivity type having a first current electrode coupled to the first power supply terminal, a second current electrode coupled to the input of the first inverter, and a control electrode for receiving a first predecoded signal; and
    a third transistor of second conductivity type having a first current electrode coupled to the input of the first inverter, a second current electrode for receiving a second predecoded signal, and a control electrode for receiving the first predecoded signal.

2. The memory of claim 1 further comprising:
    a fourth transistor of the first conductivity type having a first current electrode coupled to the first power supply terminal, a control electrode for receiving a third predecoded signal, and a second current electrode;
    a fifth transistor of the second conductivity type having a first current electrode coupled to the second current electrode of the fourth transistor, a control electrode for receiving the third predecoded signal, and a current electrode for receiving a fourth predecoded signal;
    a second inverter having an input coupled to the second current electrode of the fourth transistor, and an output for providing the first predecoded signal; and
    a sixth transistor of the first conductivity type having a first current electrode coupled to the first power supply terminal, a control electrode coupled to the output of the second inverter, and a second current electrode coupled to the input of the second inverter.

3. The memory of claim 2 further comprising:
    a second transmission gate having a first data terminal coupled to a second bit line, a second data terminal coupled to the first data line, a first control terminal, and a second control terminal;
    a third inverter having an input coupled to the first control terminal of the second transmission gate, and an output coupled to the second control terminal of the second transmission gate;
    a seventh transistor of the first conductivity type having a first current electrode coupled to the first power supply terminal, a second current electrode coupled to the input of the third inverter, and a control electrode coupled to the output of the third inverter;
    an eighth transistor of the first conductivity type having a first current electrode coupled to the first power supply terminal, a second current electrode coupled to the input of the third inverter, and a control electrode for receiving the first predecoded signal; and
    a ninth transistor of the second conductivity type having a first current electrode coupled to the input of the third inverter, a second current electrode for receiving a fifth predecoded signal, and a control electrode for receiving the first predecoded signal.

4. The memory of claim 3 wherein the first, second, fourth, sixth, seventh, and eighth transistors are P channel transistors.

5. The memory of claim 4 wherein the third, fifth, and ninth transistors are N channel transistors.

6. The memory of claim 1 further comprising:
    a second transmission gate having a first data terminal coupled to a second bit line, a second data terminal coupled to the first data line, a first control terminal, and a second control terminal;
    a second inverter having an input coupled to the first control terminal of the second transmission gate, and an output coupled to the second control terminal of the second transmission gate;
    a fourth transistor of the first conductivity type having a first current electrode coupled to the first power supply terminal, a second current electrode coupled to the input of the second inverter, and a control electrode coupled to the output of the second inverter;
    a fifth transistor of the first conductivity type having a first current electrode coupled to the first power supply terminal, a second current electrode coupled to the input of the second inverter, and a control electrode for receiving the first predecoded signal; and
    a sixth transistor of the second conductivity type having a first current electrode coupled to the input of the second inverter, a second current electrode for receiving a third predecoded signal, and a control electrode for receiving the first predecoded signal.

7. The memory of claim 6 wherein the first, second, fourth, and fifth transistors are P channel transistors.

8. The memory of claim 7 wherein the third and sixth transistors are N channel transistors.

9. In a memory having a plurality of memory cells located at intersections of word lines and bit lines, a coupling circuit comprising:
    a first transmission gate having a first data terminal coupled to a first bit line of a first bit line pair, a second data terminal coupled to a first data line of a data line pair, a first control terminal, and a second control terminal;

a second transmission gate having a first data terminal coupled to a second bit line of the first bit line pair, a second data terminal coupled to a second data line of the data line pair, a first control terminal coupled to the first control terminal of the first transmission gate, and a second control terminal coupled to the second control terminal of the first transmission gate;

a first inverter having an input coupled to the first control terminal of the first transmission gate, and an output coupled to the second control terminal of the first transmission gate;

a first transistor of a first conductivity type having a first current electrode coupled to a first power supply terminal, a second current electrode coupled to the input of the first inverter, and a control electrode coupled to the output of the first inverter;

a second transistor of the first conductivity type having a first current electrode coupled to the first power supply terminal, a second current electrode coupled to the input of the first inverter, and a control electrode for receiving a first predecoded signal; and a third transistor of a second conductivity type having a first current electrode coupled to the input of the first inverter, a second current electrode or receiving a second predecoded signal, and a control electrode for receiving the first predecoded signal.

10. The memory of claim 9 further comprising:

a fourth transistor of the first conductivity type having a first current electrode coupled to the first power supply terminal, a control electrode for receiving a third predecoded signal, and a second current electrode;

a fifth transistor of the second conductivity type having a first current electrode coupled to the second current electrode of the fourth transistor, a control electrode for receiving the third predecoded signal, and a current electrode for receiving a fourth predecoded signal;

a second inverter having an input coupled to the second current electrode of the fourth transistor, and an output for providing the first predecoded signal; and a sixth transistor of the first conductivity type having a first current electrode coupled to the first power supply terminal, a control electrode coupled to the output of the second inverter, and a second current electrode coupled to the input of the second inverter.

11. The memory of claim 10 further comprising: a third transmission gate having a first data terminal coupled to a first bit line of a second bit line pair, a second data terminal coupled to the first data line of the data line pair, a first control terminal, and a second control terminal;

a fourth transmission gate having a first data terminal coupled to a second bit line of the second bit line pair, a second data terminal coupled to the second data line of the data line pair, a first control terminal coupled to the first control terminal of the third transmission gate, and a second control terminal coupled to the second control terminal of the third transmission gate;

a third inverter having an input coupled to the first control terminal of the third transmission gate, and an output coupled to the second control terminal of the third transmission gate;

a seventh transistor of the first conductivity type having a first current electrode coupled to the first power supply terminal, a second current electrode coupled to the input of the third inverter, and a control electrode coupled to the output of the third inverter;

an eighth transistor of the first conductivity type having a first current electrode coupled to the first power supply terminal, a second current electrode coupled to the input of the third inverter, and a control electrode for receiving the first predecoded signal; and a ninth transistor of the second conductivity type having a first current electrode coupled to the input of the third inverter, a second current electrode for receiving a fifth predecoded signal, and a control electrode for receiving the first predecoded signal.

12. The memory of claim 11 wherein the first, second, fourth, sixth, seventh, and eighth transistors are P channel transistors.

13. The memory of claim 12 wherein the third, fifth, and ninth transistors are N channel transistors.

14. The memory of claim 9 further comprising:

a third transmission gate having a first data terminal coupled to a first bit line of a second bit line pair, a second data terminal coupled to the first data line of the data line pair, a first control terminal, and a second control terminal;

a fourth transmission gate having a first data terminal coupled to a second bit line of the second bit line pair, a second data terminal coupled to the second data line of the data line pair, a first control terminal coupled to the first control terminal of the third transmission gate, and a second control terminal coupled to the second control terminal of the third transmission gate;

a second inverter having an input coupled to the first control terminal of the third transmission gate, and an output coupled to the second control terminal of the third transmission gate;

a fourth transistor of the first conductivity type having a first current electrode coupled to the first power supply terminal, a second current electrode coupled to the input of the second inverter, and a control electrode coupled to the output of the second inverter;

a fifth transistor of the first conductivity type having a first current electrode coupled to the first power supply terminal, a second current electrode coupled to the input of the second inverter, and a control electrode for receiving the first predecoded signal; and a sixth transistor of the second conductivity type having a first current electrode coupled to the input of the second inverter, a second current electrode for receiving a third predecoded signal, and a control electrode for receiving the first predecoded signal.

15. The memory of claim 14 wherein the first, second, fourth, and fifth transistors are P channel transistors.

16. The memory of claim 15 wherein the third and sixth transistors are N channel transistors.

* * * * *